(12) United States Patent
Derner et al.

(10) Patent No.: US 11,250,900 B2
(45) Date of Patent: *Feb. 15, 2022

(54) HALF DENSITY FERROELECTRIC MEMORY AND OPERATION

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/001,296

(22) Filed: Aug. 24, 2020

(65) Prior Publication Data
US 2020/0388317 A1 Dec. 10, 2020

Related U.S. Application Data

(60) Continuation of application No. 16/417,004, filed on May 20, 2019, now Pat. No. 10,783,949, which is a continuation of application No. 15/854,529, filed on Dec. 16, 2017, now Pat. No. 10,360,966, which is a
(Continued)

(51) Int. Cl.
| | | |
|---|---|---|
| *G11C 11/22* | (2006.01) | |
| *G11C 7/06* | (2006.01) | |
| *G11C 7/00* | (2006.01) | |
| *G11C 7/14* | (2006.01) | |
| *G11C 11/4099* | (2006.01) | |
| *G11C 11/16* | (2006.01) | |
| *G11C 11/56* | (2006.01) | |

(52) U.S. Cl.
CPC ............ *G11C 11/2273* (2013.01); *G11C 7/14* (2013.01); *G11C 11/221* (2013.01); *G11C 11/2275* (2013.01); *G11C 11/1673* (2013.01); *G11C 11/22* (2013.01); *G11C 11/4099* (2013.01); *G11C 11/5657* (2013.01); *G11C 2211/5634* (2013.01)

(58) Field of Classification Search
CPC ..... G11C 11/2273; G11C 7/14; G11C 11/221; G11C 11/2275; G11C 11/22; G11C 11/4099; G11C 2211/5634
USPC .................................................... 365/145, 65
See application file for complete search history.

(56) References Cited

U.S. PATENT DOCUMENTS

| | | |
|---|---|---|
| 5,737,260 A | 4/1998 | Takata et al. |
| 5,751,628 A | 5/1998 | Hirano et al. |
| 6,735,108 B2 | 5/2004 | Kurth et al. |

(Continued)

*Primary Examiner* — Ly D Pham
(74) *Attorney, Agent, or Firm* — Holland & Hart LLP

(57) ABSTRACT

Methods, systems, and devices for operating a ferroelectric memory cell or cells are described. A memory array may be operated in a half density mode, in which a subset of the memory cells is designated as reference memory cells. Each reference memory cell may be paired to an active memory cell and may act as a reference signal when sensing the active memory cell. Each pair of active and reference memory cells may be connected to a single access line. Sense components (e.g., sense amplifiers) associated with reference memory cells may be deactivated in half density mode. The entire memory array may be operated in half density mode, or a portion of the array may operate in half density mode and the remainder of the array may operate in full density mode.

15 Claims, 9 Drawing Sheets

Related U.S. Application Data division of application No. 15/181,188, filed on Jun. 13, 2016, now Pat. No. 9,892,776.

(56) References Cited

U.S. PATENT DOCUMENTS

| | | | |
|---|---|---|---|
| 7,061,788 B2 | 6/2006 | Ogiwara et al. | |
| 7,525,829 B2 | 4/2009 | Kawakita et al. | |
| 7,907,456 B2 | 3/2011 | Houston et al. | |
| 9,401,196 B1 | 7/2016 | Juvekar et al. | |
| 9,715,918 B1 | 7/2017 | Kawamura | |
| 10,068,631 B2 * | 9/2018 | Juvekar | G11C 11/2295 |
| 10,360,966 B2 * | 7/2019 | Derner | G11C 11/2273 |
| 2003/0185040 A1 | 10/2003 | Riekes et al. | |
| 2004/0004855 A1 | 1/2004 | Kurth et al. | |
| 2004/0006441 A1 | 1/2004 | Rickes et al. | |
| 2005/0141260 A1 | 6/2005 | Suzuki | |
| 2005/0289294 A1 | 12/2005 | Janzen | |
| 2006/0067100 A1 * | 3/2006 | Ogiwara | G11C 11/22 365/145 |
| 2007/0081375 A1 * | 4/2007 | Kawakita | G11C 11/4097 365/63 |
| 2007/0206433 A1 | 9/2007 | Sakuma | |
| 2009/0109785 A1 * | 4/2009 | Houston | G11C 8/08 365/226 |
| 2009/0168489 A1 * | 7/2009 | Madan | G11C 11/22 365/145 |
| 2010/0097840 A1 | 4/2010 | Kim | |
| 2016/0240269 A1 * | 8/2016 | Zhou | G11C 29/50008 |
| 2016/0358640 A1 | 12/2016 | Brederlow et al. | |
| 2016/0365510 A1 * | 12/2016 | Juvekar | H01L 22/14 |
| 2017/0011790 A1 | 1/2017 | Juvekar et al. | |

* cited by examiner

HALF DENSITY FERROELECTRIC MEMORY AND OPERATION

CROSS REFERENCES

The present Application for patent is a continuation of U.S. patent application Ser. No. 16/417,004 by Derner et al., entitled "Half Density Ferroelectric Memory and Operation," filed May 20, 2019, which is a continuation of U.S. patent application Ser. No. 15/854,529 by Derner et al., entitled "Half Density Ferroelectric Memory and Operation," filed Dec. 26, 2017 which is a divisional of U.S. patent application Ser. No. 15/181,188 by Derner et al., entitled "Half Density Ferroelectric Memory and Operation," filed Jun. 13, 2016, assigned to the assignee hereof, and each of which is expressly incorporated by reference in its entirety herein.

BACKGROUND

The following relates generally to memory devices and more specifically to half density ferroelectric memory and operation.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes may, however, have a reduced sensing window because the reference signal is between the high and low signal values of the two possible logic states. This may reduce the reliability of sensing operations.

BRIEF DESCRIPTION OF THE DRAWINGS

The disclosure herein refers to and includes the following figures.

DETAILED DESCRIPTION

A memory array may be operated in a half density mode, in which a subset of the memory cells and sense components are used. For example, half of the memory cells of the array may be used as reference cells, and each reference cell may be paired with an active cell. The reference cells may be programmed with a logic value opposite the active cell, and the output of the reference cell may be routed to a sense component connected to the paired active memory cell. As such, the sense window may be equal to the difference between the two logic states, which, in some cases, may be twice the size of sense windows of other sensing schemes. Moreover, half of the sense components may be deactivated and thus the half density mode may use less power to operate compared to full density operation. The techniques described herein may be used to achieve a true half density mode, because in some cases, no extra memory cells or components beyond those in a full density configuration are needed to generate reference signals.

During a sensing operation, a ferroelectric memory cell may be accessed by an access line (e.g., a word line) and polarized by a plate line. In full density mode, multiple word lines and cell plates may be energized in order to sense a memory cell. For example, in addition to the active cell, a reference signal may be generated by extra components, such as another memory cell connected to an additional word line and plate line.

In half density mode, the reference signal may be generated by a memory cell that is in electronic communication with the same word line and plate line of an active memory cell. So a memory cell may be sensed by energizing a single word or plate line, thus reducing power consumption. Moreover, half of the sense components may not be needed and may thus be disabled. Because components beyond the existing memory cells may not be needed to generate reference signals in the half density mode, less space of the substrate may be used for devices other than memory cells.

In some examples, the memory array operation may be converted from full density mode to half density mode. For example, half of the memory cells may be identified as active cells, and each active cell may be paired with another memory cell that acts as a reference cell. The logic value of the active cell may be determined and the opposite logic value may be written to its paired reference cell.

Features of the disclosure introduced above are further described below in the context of a memory array. Specific examples are then described for half density ferroelectric memory and operation. These and other features of the disclosure are further illustrated by and described with reference to apparatus diagrams, system diagrams, and flowcharts that relate to half density ferroelectric memory and operation.

Figure 1:
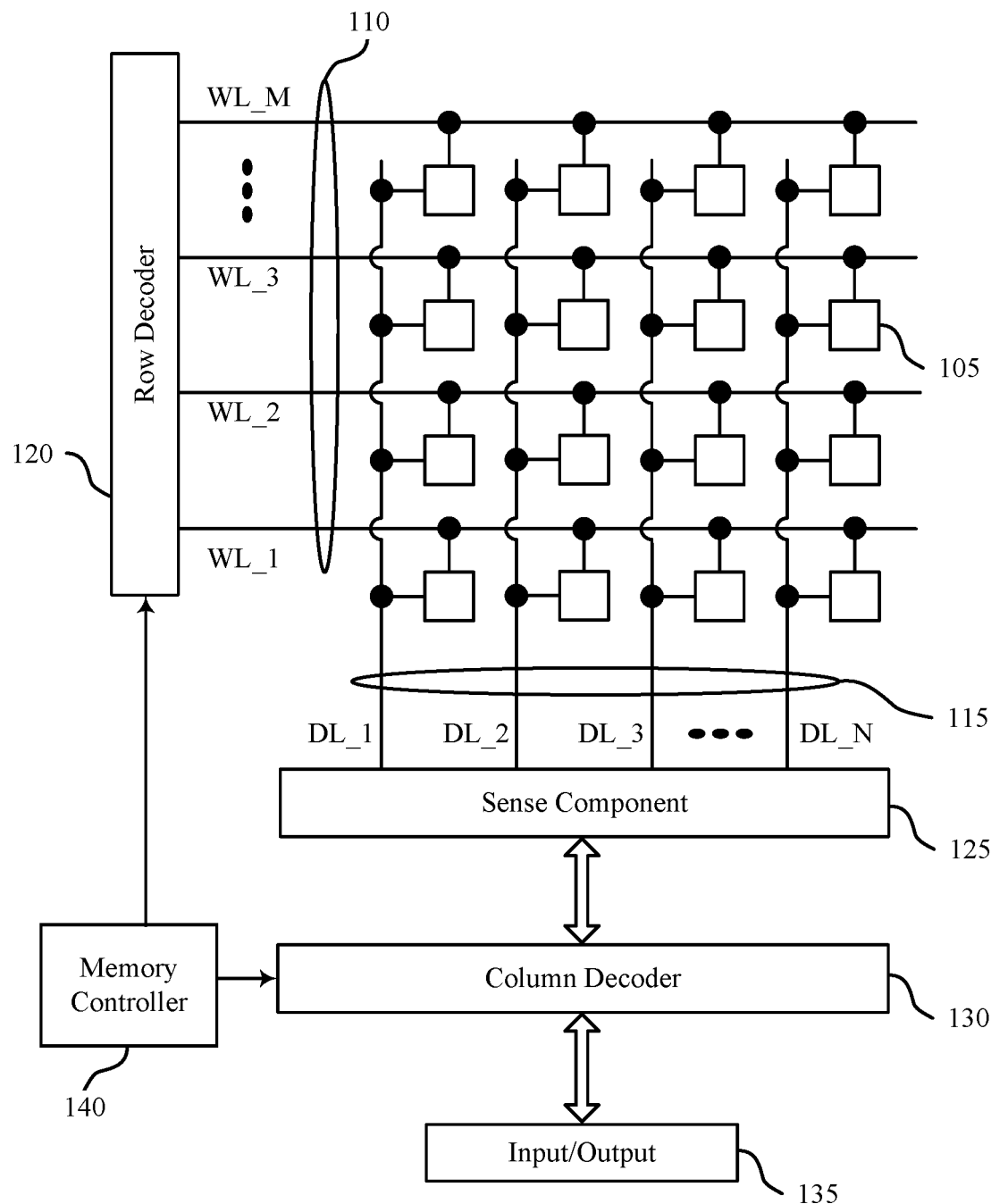
FIG. 1 illustrates an example memory array that supports half density ferroelectric memory and operation in accordance with various embodiments of the present disclosure.

FIG. 1 illustrates an example memory array 100 that supports half density ferroelectric memory and operation in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate access line 110 and digit line 115. Access lines 110 may also be referred to as word lines 110, and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

In half density mode, the reference voltage may be generated by a reference memory cell 105. For example, half of the memory cells 105 may be designated as reference memory cells 105, and each reference memory cell 105 may be paired to an active memory cell 105. The reference memory cell 105 may be programmed with a logic value opposite of the active memory cell 105. Sensing an active memory cell 105 may include accessing the reference memory cell 105, where the output signal of the reference memory cell 105 is used as the reference signal for sensing the active memory cell 105. Sense component 125 may include various transistors or amplifiers in order to detect and amplify a difference in the signals, which may be referred to as latching. The detected logic state of memory cell 105 may then be output through column decoder 130 as output 135.

A memory cell 105 may be programmed, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed herein, ferroelectric memory cells 105 may have beneficial properties that may result in improved performance relative to other memory architectures. Additionally, operating in half density mode may consume less power and may increase sensing reliability due to an increased sense window, as discussed below.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. When operating in half density mode, the memory controller 140 may identify some memory cells 105 as reference memory cells 105. The memory controller 140 may also determine the logic state of active memory cells 105 and write the opposite logic value to their respectively paired active memory cells 105.

Figure 2:
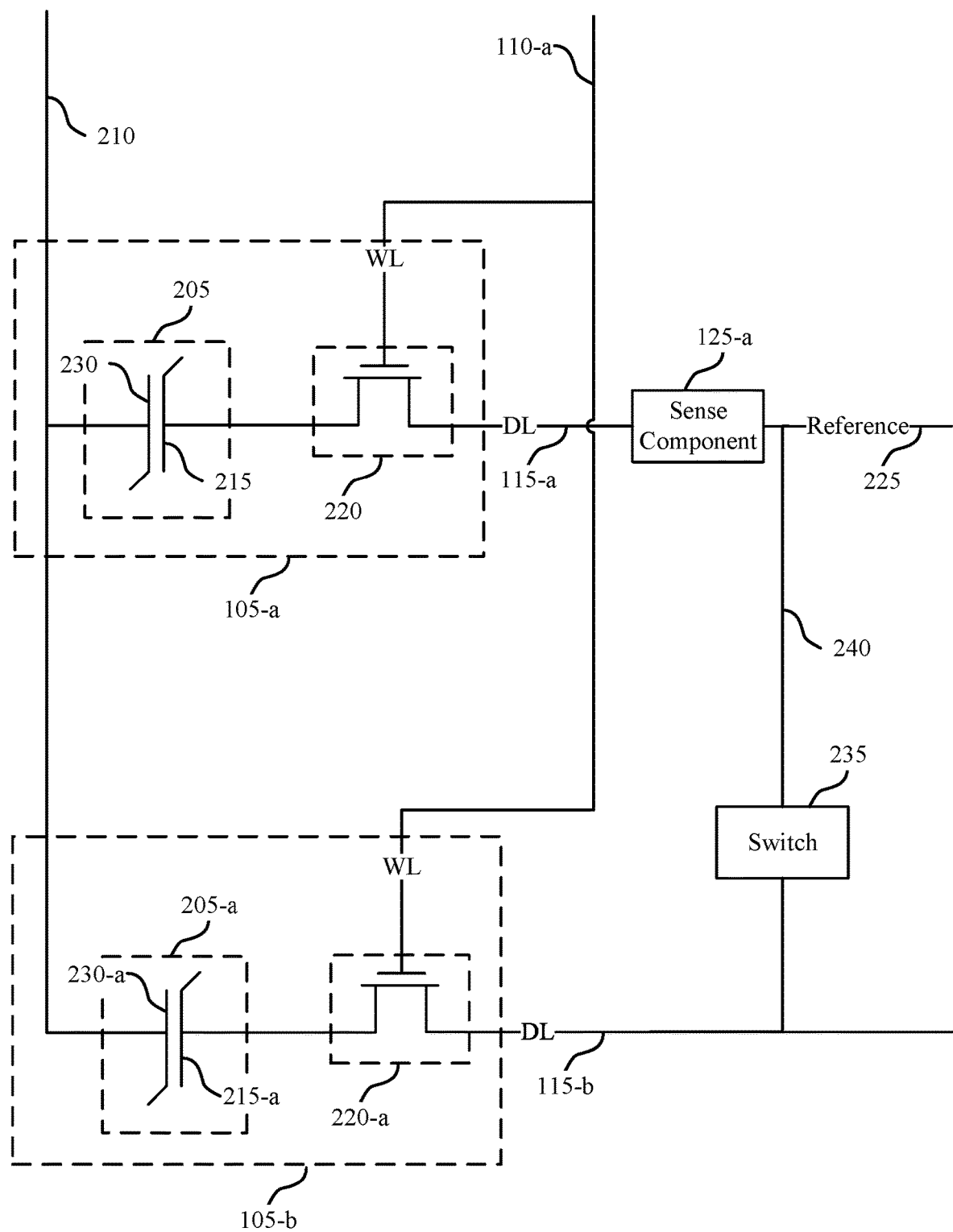
FIG. 2 illustrates an example circuit of a memory cell that supports half density ferroelectric memory and operation in accordance with various embodiments of the present disclosure.

FIG. 2 illustrates an example circuit 200 that includes a memory cell 105 and supports half density ferroelectric memory and operation in accordance with various embodiments of the present disclosure. Circuit 200 includes memory cells 105-*a* and 105-*b*, word line 110-*a*, digit lines 115-*a* and 115-*b*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Memory cell 105-*b* may also include a logic storage component, such as capacitor 205-*a* that has a first plate, cell plate 230-*a*, and a second plate, cell bottom 215-*a*. Cell plates 230 and cell bottoms 215 may be capacitively coupled through a ferroelectric material positioned between them. The orientation of cell plates 230 and cell bottoms 215 may be flipped without changing the operation of memory cell 105-*a*. Circuit 200 also includes selection components 220 and 220-*a* and reference signal 225. Circuit 200 also includes conductive line 240 and switch 235. Memory cell 105-*b* may be in electronic communication with sense component 125-*a* through conductive line 240, and switch 235 may be positioned in series with conductive line 240 and electrically connect or isolate memory cell 105-*b* from sense component 125-*a*. In some examples, memory cell 105-*b* may provide a reference signal for sense component 125-*a* to determine the logic state of memory cell 105-*a*.

In the example of FIG. 2, cell plates 230 and 230-*a* may be accessed via plate line 210, and cell bottom 215 and 215-*a* may be accessed via digit line 115-*a* and 115-*b*, respectively. In other words, memory cells 105-*a* and 105-*b* may be commonly connected to a single plate line 210. As described above, various states may be stored by charging or discharging capacitor 205.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the transistor's threshold voltage. Word line 110-*a* may activate selection component 220; for example, a voltage applied to word line 110-*a* is applied to the transistor gate, connecting capacitor 205 with digit line 115-*a*. Word line 110-*a* is in electronic communication with selection components 220 and 220-*a* of memory cells 105-*a* and 105-*b*, respectively. Thus, activating word line 110-*a* may activate both memory cells 105-*a* and 105-*b*.

In some examples, the positions of selection component 220 and capacitor 205 may be switched, such that selection component 220 is connected between plate line 210 and cell plate 230 and such that capacitor 205 is between digit line 115-*a* and the other terminal of selection component 220. In such cases, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 and 205-*a* may not discharge upon connection to digit line 115-*a* and 115-*b*, respectively. To sense the logic state stored by ferroelectric capacitor 205, word line 110-*a* may be biased to select memory cell 105-*a* and 105-*b*, and a voltage may be applied to plate line 210. The plate line 210 bias may be applied after activating selection component 220, or the bias may be constantly applied to cell plate 230. Biasing plate line 210 may result in a voltage difference across capacitors 205 and 205-*a*, which may yield a change in the stored charge on capacitors 205 and 205-*a*. The magnitude of the change in stored charge may depend on the initial state of each capacitor 205—e.g., whether the initial state stored a logic 1 or a logic 0. This may cause a change in the voltage of digit line 115-*a* based on the charge stored on capacitor 205, which may be used to determine the stored logic state.

The change in voltage of digit lines 115-*a* and 115-*b* may depend on their intrinsic capacitance—as charge flows through digit lines 115-*a* and 115-*b*, some finite charge may be stored in each digit line 115 and the resulting voltage depends on the intrinsic capacitance. The intrinsic capacitance may depend on physical characteristics, including the dimensions, of each digit line 115. Digit line 115-*a* and 115-*b* may connect many memory cells 105 so digit line 115-*a* and 115-*b* may have a length that results in a non-negligible capacitance (e.g., on the order of picofarads (pF)). In full density mode, both memory cells 105-*a* and 105-*b* may be sensed—i.e., the resulting voltage of digit line 115-*a* and 115-*b* may be compared to a reference (e.g., a voltage of reference line 225) by a sense component 125 in order to determine the stored logic state in each memory cell 105. For example, memory cell 105-*a* may be sensed by sense component 125-*a* and memory cell 105-*b* may be sense by another sense component 125 (not shown).

In half density mode, memory cell 105-*b* may serve as a reference signal for sensing of memory cell 105-*a*. For example, digit line 115-*b* may be routed to sense component 125-*a* using conductive line 240. Switch 235 may be closed to electrically connect memory cell 105-*b* to sense component 125-*a*. In such cases, reference 225 may not be present. Thus, by activating word line 110-*a* and plate line 210, both memory cells 105-*a* and 105-*b* may generate a signal. For example, memory cell 105-*b*, when acting as a reference cell in half density mode, may have a logic state opposite of memory cell 105-*a*. Sense component 125-*a* may compare the signal generated by memory cell 105-*a* (in response to biasing plate line 210) to that generated by 105-*b*. Thus, memory cell 105-*a* may be sensed by activating one word line 110 and one plate line 210. In some examples, switch 235 may be a transistor, for example, an n-type field effect transistor, and may be activated by applying a voltage equal to or greater than its threshold voltage.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference signal 225, which may be a reference voltage, or, in half density mode, that of memory cell 105-*b*. The sense amplifier output may be driven to the higher (e.g., a positive) or lower (e.g., negative or ground) supply voltage based on the comparison. For instance, if digit line 115-*a* has a higher voltage than reference signal 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. In half density mode, the sense amplifier may drive digit line 115-*b* to the opposite value—that is, if digit line 115-*a* goes to the positive supply voltage, digit line 115-*b* may be driven to ground or a negative voltage. Alternatively, if digit line 115-*a* has a lower voltage than reference signal 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In some examples, selection component 220 may be activated through word line 110-*a* in order to electrically connect capacitor 205 to digit line 115-*a*. For a ferroelectric capacitor 205, a voltage may be applied across capacitor 205 by controlling the voltage of cell plate 230 (through plate line 210) and cell bottom 215 (through digit line 115-*a*) to apply a positive or negative voltage across the capacitor 205. A similar process may be performed to write a logic value to memory cell 105-*b*.

In some examples, a write-back operation may be performed after sensing. For example, the sense operation may degrade or destroy the originally stored logic value of the memory cell 105. After sensing, the detected logic value may be written back to the memory cell 105. For example, sense component 125-*a* may determine the logic state of memory cell 105-*a* and may then write the same logic state back. In some examples, sense component 125-*a* may also write the opposite logic value to memory cell 105-*b* when operating in half-density mode.

Figure 3A:
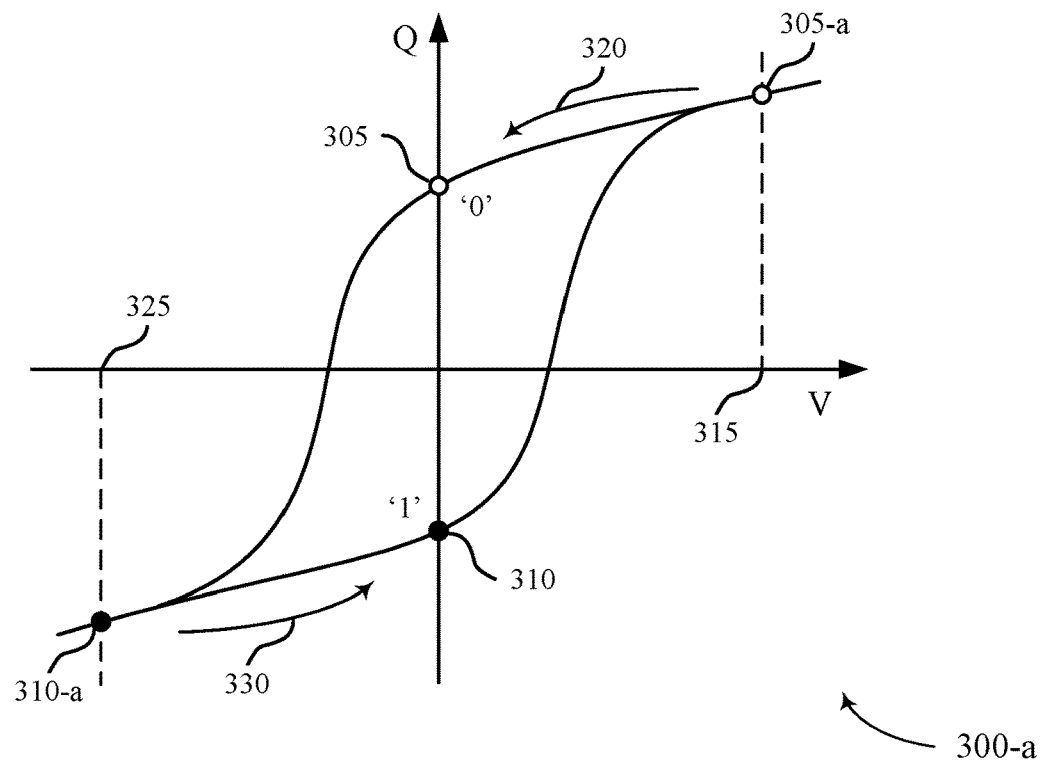
FIGS. 3A-3B illustrate example hysteresis plots for a ferroelectric memory cell that supports half density ferroelectric memory and operation in accordance with various embodiments of the present disclosure.
Figure 3B:
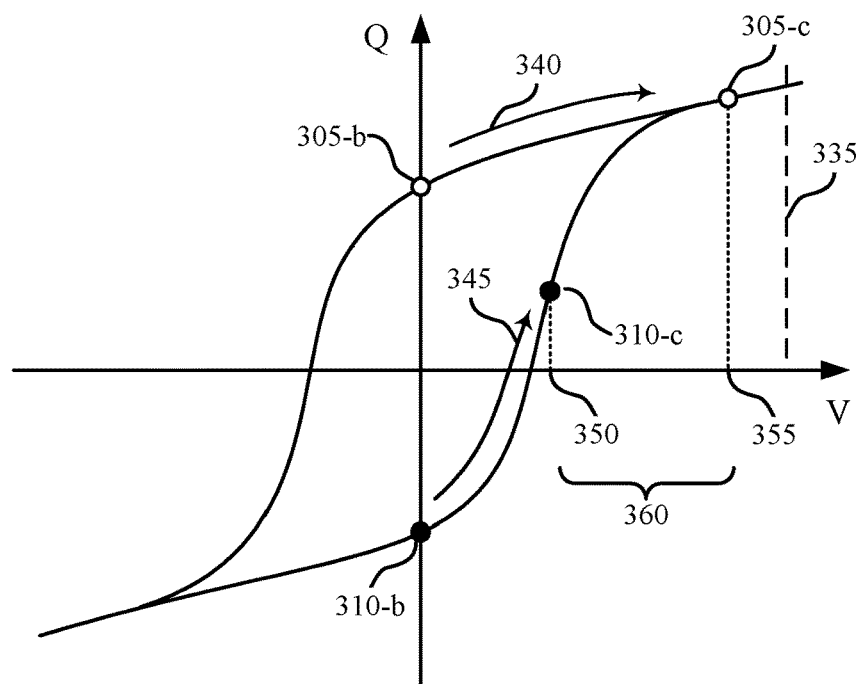

FIG. 3A and FIG. 3B illustrate examples of non-linear electrical properties with hysteresis curves 300-*a* (FIG. 3A) and 300-*b* (FIG. 3B) for a memory cell that supports half density ferroelectric memory and operation in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310.

According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 35—i.e., (voltage 335–voltage 350) or (voltage 335–voltage 355). In full density mode, a reference voltage may be generated such that its magnitude is between the two possible digit line voltages in order to determine the stored logic state—i.e., if the digit line voltage is higher or lower than the reference voltage. For example, the reference voltage may be an average of the two quantities (voltage 335–voltage 350) and (voltage 335–voltage 355). Upon comparison by the sense component, the sensed digit line voltage may be determined to be higher or lower than the reference voltage, and the stored logic value of the ferroelectric memory cell (i.e., a logic 0 or 1) may be determined.

In half density mode, a reference memory cell 105 may have a logic state opposite its paired active memory cell 105. For example, active memory cell 105 may be a logic 0 and reference memory cell 105 may be programmed to a logic 1. During sensing of the active memory cell 105, both active and reference memory cells 105 may be biased as discussed above. Sense component 125 may use the signal generated by the reference memory 105 as its reference input. That is, sense component 125 may compare voltage 355 to voltage 350. As such, sense window 360—the difference in voltage between the sensed memory cell 105 and the reference signal—is now larger than in the full density mode. For example, sense window 360 may be equal to voltage 355–voltage 350. This may be twice as large compared to the sense window in full density mode. In some examples, active memory cell 105 may be a logic 1 and reference memory cell 105 may be programmed to a logic 0. Sense component 125 may compare voltage 350 to voltage 355. As such, sense window 360 may be as larger or larger than in a full density mode.

Figure 4:
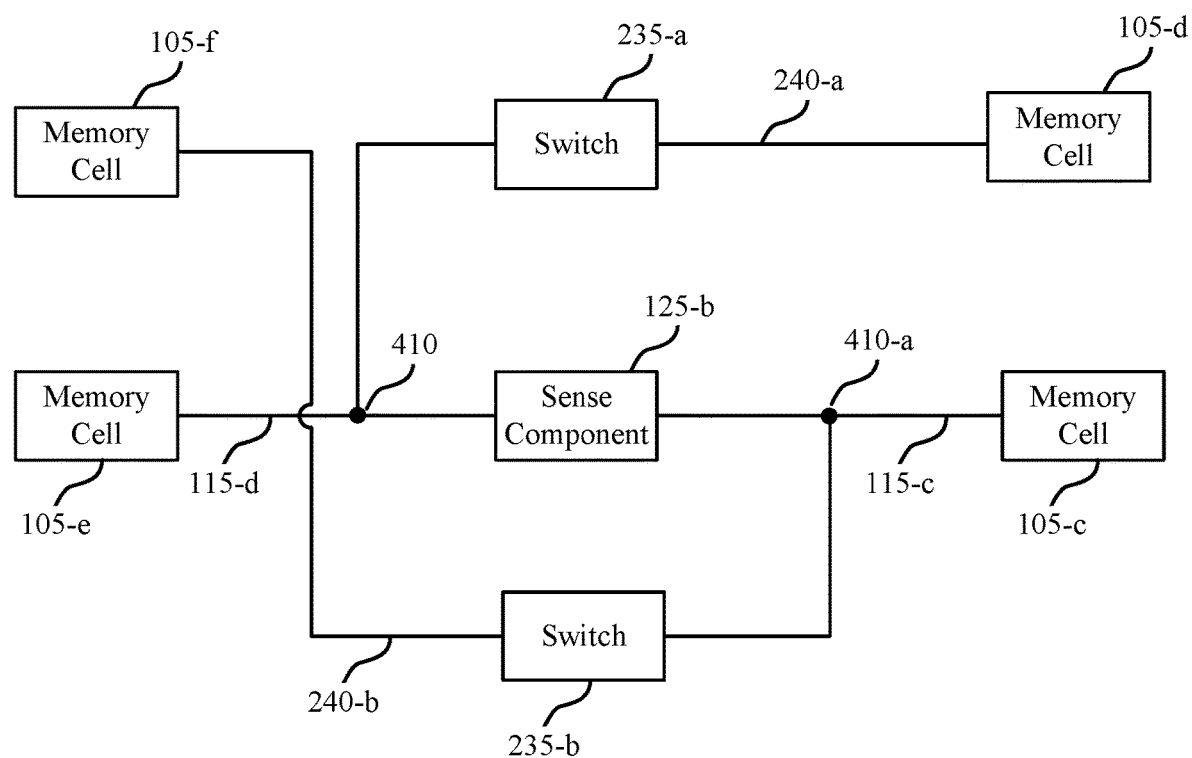
FIG. 4 illustrates an example circuit that supports half density ferroelectric memory and operation in accordance with various embodiments of the present disclosure.

FIG. 4 illustrates an example circuit 400 that supports half density ferroelectric memory and operation in accordance with various embodiments of the present disclosure. Circuit 400 includes ferroelectric memory cells 105-c, 105-d, 105-e, and 105-f; digit lines 115-c and 115-d, and sense component 125-b, which may be examples of a memory cell 105, digit line 115, and sense component 125, respectively, as described with reference to FIGS. 1 and 2. Memory cells 105-c and 105-e may be in electronic communication with sense component 125-b through digit lines 115-c and 115-d, respectively. Memory cells 105-d and 105-f may be in electronic communication with sense component 125-b through conductive lines 240-a and 240-b, respectively. Conductive lines 240-a and 240-b and switches 235-a and 235-b may be examples of a conductive line 240 and switch 235 with reference to FIG. 2.

Switches 235-a and 235-b may be positioned in series with conductive line 240-a and 240-b, respectively. Conductive line 240-a and digit line 115-d may intersect at node 410, where node 410 is located between memory cell 105-e and sense component 125-b. Conductive line 240-b may be connected to digit line 115-c at node 410-a, where node 410-a is located between memory cell 105-c and sense component 125-b.

Switch 235-a may be operated to electrically connect memory cell 105-d to sense component 125-b while switch 235-b may be operated to electrically connect memory cell 105-f to sense component 125-b. For example, in half-density mode, memory cells 105-d and 105-f may serve as references, and switches 235-a and 235-b may be used to reroute memory cells 105-d and 105-f to sense component 125-b. Thus, a sense operation of memory cell 105-c may include activating both memory cells 105-c and 105-d. Switch 235-a may be closed such that sense component 125-b may use the output signal of memory cell 105-d as a reference signal for determining the stored logic state of memory cell 105-c. In a similar manner, a sense operation of memory cell 105-e may include activating both memory cells 105-e and 105-f Switch 235-b may be closed such that sense component 125-b may use the output signal of memory cell 105-f as a reference signal for determining the stored logic state of memory cell 105-e.

Figure 5:
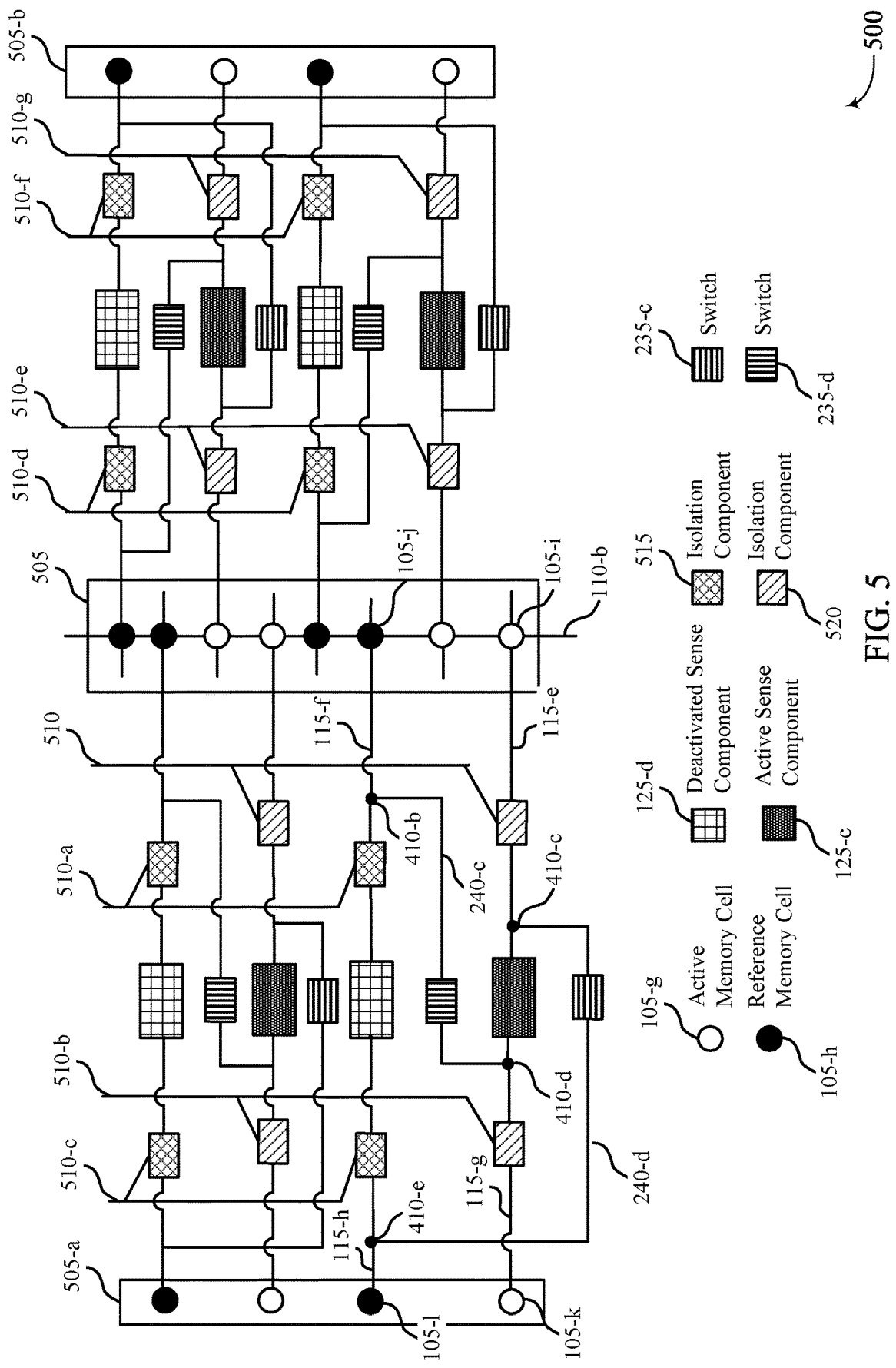
FIG. 5 illustrates an example memory array that supports half density ferroelectric memory and operation in accordance with various embodiments of the present disclosure.

FIG. 5 illustrates an example memory array 500 that supports half density ferroelectric memory and operation in accordance with various embodiments of the present disclosure. Memory array 500 includes multiple array sections, for example, array sections 505, 505-a, and 505-b. Array sections 505, 505-a, and 505-b contain memory cells 105 that may be active or reference memory cells 105, for example, active memory cells 105-*g* and reference memory cells 105-*h*. For example, array section 505 contains active memory cell 105-*i* and reference memory cell 105-*j*, which may be connected to a common access line, such as word line 110-*b*. Word line 110-*b* may be an example of a word line 110 described with reference to FIGS. 1 and 2, and active memory cells 105-*g* and reference memory cells 105-*h* may be examples of memory cells 105 described with reference to FIGS. 1, 2, and 4. Memory array 500 also includes active sense components 125-*c* and deactivated sense components 125-*d*, which may be examples of a sense component 125 described with reference to FIGS. 1, 2, and 4. Memory array also includes switches 235-*c* and switches 235-*d*, which may be examples of a switch 235 described with reference to FIGS. 2 and 4. Additionally, memory array 500 includes isolation components 515 and isolation components 520, which may isolate reference memory cells 105-*h* from deactivated sense components 125-*d* when operating in half density mode. Isolation components 515 and 520 may be operated by isolation component control lines 510.

In the half density mode, some memory cells 105 may be configured to operate as reference memory cells 105-*h* by storing a logic value opposite of its paired active memory cell 105-*g*. The reference memory cells 105-*h* may be used to generate the reference signals for active sense components 125-*c*. As such, some sense components may be deactivated, for example, deactivated sense components 125-*d*. Such an architecture may convert the memory array 500 from an open-digit line architecture to folded-digit line architecture.

Each memory cell 105 may be connected to a sense component 125 through a conductive digit line 115. For example, memory cells 105-*i* and 105-*k* may be in electronic communication with an active sense component 125-*c* through digit line 115-*e* and 115-*g*, respectively. Memory cells 105-*j* and 105-*l* may be in electronic communication with a deactivated sense component 125-*d* through digit lines 115-*f* and 115-*h*, respectively. In half density mode, reference memory cell 105-*j* may be electrically re-routed to the active sense component 125-*c* to serve as a reference signal. For example, conductive line 240-*c* may connect digit line 115-*f* of the reference memory cell 105-*j* to the active sense component 125-*c*. Conductive line 240-*c* may be connected to digit line 115-*f* at node 410-*b* and to digit line 115-*g* at node 410-*d*. Node 410-*b* may be located between memory cell 105-*j* and isolation component 515, as depicted in FIG. 5. Node 410-*d* may be positioned between the active sense component 125-*c* and isolation component 520. Switch 235-*d* may be located in series with conductive line 240-*c* and, when closed, may electrically connect digit line 115-*f* of reference memory cell 105-*j* to the active sense component 125-*c*.

Similarly, conductive line 240-*d* may connect digit line 115-*h* of the reference memory cell 105-*i* to the active sense component 125-*c*. Conductive line 240-*d* may be connected to digit line 115-*g* at node 410-*e* and to digit line 115-*e* at node 410-*c*. Node 410-*e* may be located between memory cell 105-*l* and isolation component 515, as depicted in FIG. 5. Node 410-*c* may be positioned between the active sense component 125-*c* and isolation component 520. Switch 235-*c* may be located in series with conductive line 240-*d* and, when closed, may reroute digit line 115-*h* of reference memory cell 105-*l* to the active sense component 125-*c*. In some examples, switches 235-*c* and 235-*d* may be transistors, for example, an n-type transistor.

Thus, circuit 500 includes a first ferroelectric memory cell 105-*i* in electronic communication with an access line 110-*b*; a second ferroelectric memory cell 105-*j* in electronic communication with the access line 110-*b*; and a first sense component 125-*c* in electronic communication with the first ferroelectric memory cell 105-*i* and the second ferroelectric memory cell 105-*j*. Circuit 500 also includes a first switch 235-*d* between the second ferroelectric memory cell 105-*j* and the first sense component 125-*c*, where the second ferroelectric memory cell 105-*j* is a reference input to the first sense component 125-*c* for sensing operations of the first ferroelectric memory cell 105-*i*. In some cases, the first switch 235-*d* comprises a transistor operable to couple the second ferroelectric memory cell 105-*j* to the first sense component 125-*c*.

Circuit 500 also includes a third ferroelectric memory cell 105-*k* in electronic communication with the first sense component 125-*c*, a fourth ferroelectric memory cell 105-*l* in electronic communication with the first sense component 125-*c*, and a second switch 235-*c* between the fourth ferroelectric memory cell 105-*i* and the first sense component 125-*c*, where the fourth ferroelectric memory cell 105-*l* is a reference input to the first sense component 125-*c* for sensing operations of the third ferroelectric memory cell 105-*k*.

Isolation component control line 510 may control the operation of isolation components 515 and isolation components 520. For example, isolation components 515 and 520 may be transistors, and isolation component control lines 510 may apply a voltage to the transistors to control their operation. That is, circuit 500 includes a first isolation device 520 between the first ferroelectric memory cell 105-*i* and the first sense component 125-*c*, and a first activation line 510 in electronic communication with the first isolation device 520.

Circuit 500 may further include a second sense component 125-*d* in electronic communication with the second ferroelectric memory cell 105-*j*, a second isolation device 515 between the second ferroelectric memory cell 105-*j* and the second sense component 125-*d*, and a second activation line 510-*a* in electronic communication with the second isolation device 515.

Circuit 500 may also include a third isolation device 520 between the third ferroelectric memory 105-*k* and the first sense component 125-*c*, and a third activation line 510-*b* in electronic communication with the third isolation device 520. In some examples, a fourth isolation device 515 may be positioned between the fourth ferroelectric memory cell 105-*l* and the second sense component 125-*d*, and a fourth activation line 510-*c* is in electronic communication with the fourth isolation device 515.

In half density mode (or configuration), active memory cells 105-*h* of an array section 505 may be sensed. For example, active memory cell 105-*i* and reference memory cell 105-*j* of array section 505 may be selected using word line 110-*b*. Isolation components 520 may be closed to electrically connect active memory cell 105-*i* to active sense component 125-*c*. For example, isolation component control line 510 may be biased to close isolation component 520. Additionally, switches 235-*d* may be closed in order to route the output of reference memory cell 105-*j* to sense component 125-*c*. Meanwhile, isolation components 515 may be open such that reference memory cell 105-*j* is electrically isolated from deactivated sense component 125-*d*. For example, no bias may be applied to isolation component control line 510-*a* in order to maintain isolation components 515 in an open state. Additionally, switches 235-*c* may be open as well since array section 505 is being operated. The memory cells of array section 505 may be biased using a plate line 210 (not shown), and active sense components 125-*c* may be activated to determine the logic state of active memory cells 105-*g* of array section 505.

In other words, a first ferroelectric memory cell in electronic communication with an access line of the memory array (e.g., active memory cell 105-*g*) may be selected, and a second ferroelectric memory in electronic communication with the access line cell (e.g., reference memory cell 105-*h*) may be selected, where the logic state of the first ferroelectric memory cell may be determined based on a logic state of the second ferroelectric memory cell. In some examples, determining the logic state of the first ferroelectric memory cell includes comparing a first signal indicative of the logic state of the first ferroelectric memory cell to a second signal indicative of the logic state of the second ferroelectric memory cell at a same sense component (e.g., active sense component 125-*c*). The first signal indicative of the logic state of the first ferroelectric memory cell may be a voltage due to a charge extracted from the first ferroelectric memory cell; or the first signal may be the charge itself. Likewise, the second signal indicative of the logic state of the second ferroelectric memory cell may be a voltage due to a charge extracted from the second ferroelectric memory cell; or the second signal may be charge itself.

In some cases, the logic state of the second ferroelectric memory cell may be opposite the logic state of the first ferroelectric memory cell. In some examples, a switch (e.g., switch 235-*c* or 235-*d*) may be activated to couple the second ferroelectric memory cell with the sense component that is in electronic communication with the first ferroelectric memory cell. In some cases, a voltage may be applied to an isolation component to couple the first ferroelectric memory cell with a sense component. For example, isolation component control line 510 may be energized to apply a voltage to isolation component 520.

In some examples, a write-back operation may be performed based on determining the logic state of the first ferroelectric memory cell, where the write-back operation restores the logic state of the first ferroelectric memory cell and the logic state of the second ferroelectric memory cell.

In some examples of the operation of circuit 500, an active memory cell 105-*g* may be programmed. For example, a command may be received to write the first ferroelectric memory cell with a logic state, and the first ferroelectric memory cell may be written with the logic state in response to the command, for example, by a memory controller 140. In some examples, the second ferroelectric memory cell (e.g., the reference memory cell 105-*h*) may be written with an opposite logic state based on receiving the command to write to the first ferroelectric memory cell.

In some cases, control signals for the isolation components 515 and 520 may be doubled by breaking them into "odd" and "even" isolation component selections. That is, some signals may activate "even" components and other signals may activate "odd" components. For example, isolation components 520 may be considered an "even" component, as well as their respective isolation component control lines 510, 510-*b*, 510-*e*, and 510-*g*. Likewise, isolation components 515 may be considered an "odd" component, as well as their respective isolation component control lines 510-*a*, 510-*c*, 510-*d*, and 510-*f*.

The memory array 500 may operate in either full density or half density mode. In full density mode, all sense components 125 are active, i.e., both deactivated sense components 125-*d* become active sense components 125-*c*. Additionally, even and odd isolation control component lines 510 may be operated together. For example, when sensing memory cells 105 of array section 505, both isolation component control lines 510 and 510-*a* on the left side and 510-*d* and 510-*c* on the right side may be biased to close their respective switches, thus connecting the memory cells 105 to the sense components 125. Also in full density mode, switches 235-*c* and 235-*d* may be opened.

In some examples, the half density mode may be enabled based on an external signal, for example, a user input. That is, an indication may be received to operate a plurality of memory cells 105 of the ferroelectric memory array 500 in a half density mode. In such examples, a first half of the plurality of memory cells may be identified as active memory cells 105-*g*, and a second half of the plurality of memory cells 105 may be identified as reference memory cells 105-*h*. Each active memory cell 105-*g* of the first half may be paired to a reference memory cell 105-*h* of the second half. In some examples, an active memory cell (e.g., active memory cell 105-*i*) and a reference memory cell (e.g., reference memory cell 105-*j*) of each pair are in electronic communication with a common access line (e.g., word line 110-*b*).

In some examples, the indication may be received from a user or device of which the ferroelectric memory array is a component. In other examples, the indication may be based on determining that a temperature of the memory array is outside a range of temperatures.

In some cases, a plurality of sense components in electronic communication with the reference memory cells (e.g., deactivated sense components 125-*d*) may be deactivated. In some examples, a logic state for an active memory cell 105-*g* may be determined and a logic state opposite the logic state of the active memory cell may be written to a reference memory cell 105-*g* paired to the active memory cell.

In some examples, a portion of the memory array 500 may be operated in half density mode and another portion may be operate in full density mode. That is, the plurality of memory cells is a first subset of the ferroelectric memory array and a remainder of the memory cells is a second subset of the ferroelectric memory array. The first subset of the ferroelectric memory array may be operated in the half density mode. The second subset of the ferroelectric memory array may be operated in a normal mode (e.g., full density mode), where each memory cell 105 coupled to a common access line of the second subset is an active memory cell. In some examples, the first subset of the ferroelectric memory array may be a sector or a bank.

In some cases, the originally stored data in an active memory cell 105-*g* that is converted to a reference memory cell 105-*h* (e.g., a memory cell 105 transitioning from normal to half density mode) may be stored in another part of the array. That is, a logic state of at least one reference memory of the first subset of the ferroelectric memory array may be stored in a memory cell of the second subset of the ferroelectric memory array.

Figure 6:
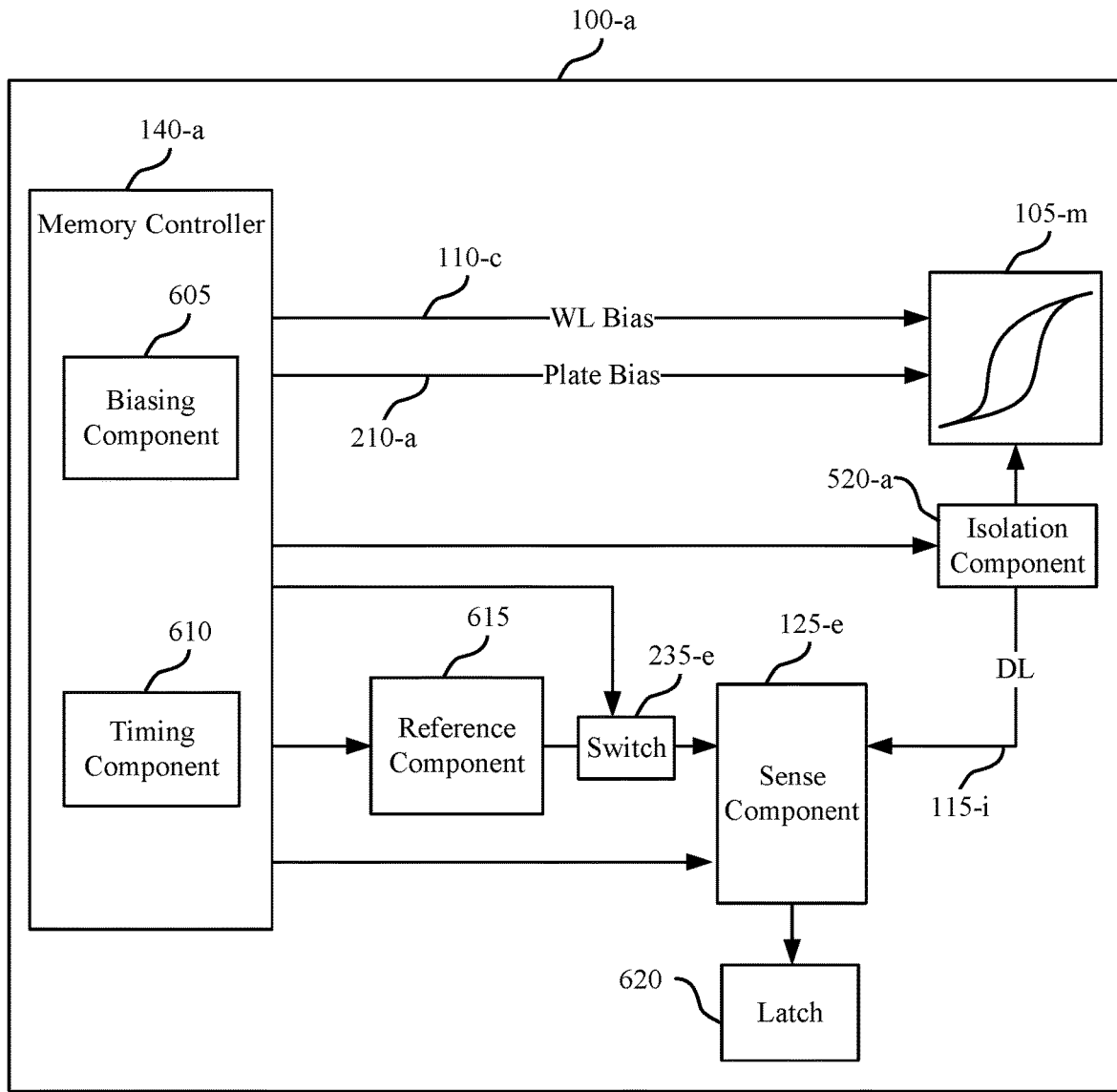
FIG. 6 illustrates a block diagram of an example ferroelectric memory array that supports half density ferroelectric memory and operation in accordance with various embodiments of the present disclosure.

FIG. 6 shows a block diagram 600 of a memory array 100-*a* that supports half density ferroelectric memory and operation in accordance with various embodiments of the present disclosure. Memory array 100-*a* may be referred to as an electronic memory apparatus and includes memory controller 140-*a* and memory cell 105-*m*, which may be examples of memory controller 140 and memory cell 105 described with reference to FIG. 1, 2, 4, or 5. Memory controller 140-*a* may include biasing component 605 and timing component 610 and may operate memory array 100-*a* as described in FIG. 1. Memory controller 140-*a* may be in electronic communication with word line 110-c, digit line 115-i, sense component 125-e, and plate line 210-a, which may be examples of word line 110, digit line 115, sense component 125, and plate line 210 described with reference to FIG. 1, 2, 4, or 5. Memory controller 140-a may also be in electronic communication with switch 235-a and isolation component 520-a, which may be examples of a switch 235 and isolation component 520, respectively, described with reference to FIG. 2, 4, or 5. Memory array 100-a may also include reference component 615 and latch 620. In some cases, reference component 615 may be a reference memory cell 105 that is in electronic communication with word line 110-c and 210-a. The components of memory array 100-a may be in electronic communication with each other and may perform the functions described with reference to FIGS. 1-3. In some cases, reference component 615, sense component 125-e and latch 620 may be components of memory controller 140-a.

Memory controller 140-a may be configured to activate word line 110-c, plate 210-a, or digit line 115-i by applying voltages to those various nodes. For example, biasing component 605 may be configured to apply a voltage to operate memory cell 105-m to read or write memory cell 105-m as described above. In some cases, memory controller 140-a may include a row decoder, column decoder, or both, as described with reference to FIG. 1. This may enable memory controller 140-a to access one or more memory cells 105. Biasing component 605 may also provide voltage potentials to reference component 615 in order to generate a reference signal for sense component 125-e. Additionally, biasing component 605 may provide voltage potentials for the operation of sense component 125-e.

In some examples, reference component 615 may be a reference memory cell 105 paired with memory cell 105-m, as discussed above. Thus, sense component 125-e may be in electronic communication with a first ferroelectric memory cell 105-m and a second ferroelectric memory cell (reference component 615). Switch 235-e may be positioned between the second ferroelectric memory cell and the sense component 125-e. In some examples, memory controller 140-a may receive an access operation request for the first ferroelectric memory cell 105-m and select the first ferroelectric memory cell 105-m and the second ferroelectric memory cell (reference component 615) based on receiving the access operation request for the first ferroelectric memory cell 105-m. Memory controller 140-a may activate switch 235-e between the second ferroelectric memory cell and the sense component 125-e based on receiving the access operation request for the first ferroelectric memory cell 105-m and activate sense component 125-e, where the second ferroelectric memory cell comprises a reference input to sense component 125-e.

In some cases, isolation device 520-a may be between the first ferroelectric memory cell 105-m and the sense component 125-e. Memory controller 140-a may activate isolation device 520-a based on receiving the access operation request for the first ferroelectric memory cell 105-m—that is, memory controller 140-a may electrically connect memory cell 105-m to sense component 125-e.

Memory controller 140-a may further determine a logic state of the first ferroelectric memory cell 105-m based on activating sense component 125-e, write the logic state of the first ferroelectric memory cell 105-m back to the first ferroelectric memory cell 105-m, and write a logic state to the second ferroelectric memory cell (reference component 615) that is opposite the logic state of the first ferroelectric memory cell 105-m.

In some cases, memory controller 140-a may perform its operations using timing component 610. For example, timing component 610 may control the timing of the various word line selections or plate biasing, including timing for switching and voltage application to perform the memory functions, such as reading and writing, discussed herein. In some cases, timing component 610 may control the operations of biasing component 605.

Reference component 615 may include various components to generate a reference signal for sense component 125-e. Reference component 615 may include circuitry configured to produce a reference signal. In some cases, such as in half density mode, reference component 615 may be other ferroelectric memory cells 105. In other examples, such as normal or full density mode, reference component 615 may be configured to output a voltage with a value between the two sense voltages, as described with reference to FIG. 3. Or reference component 615 may be designed to output a virtual ground voltage (i.e., approximately 0V).

Sense component 125-e may compare a signal from memory cell 105-m (through digit line 115-i) with a reference signal from reference component 615. Upon determining the logic state, the sense component may then store the output in latch 620, where it may be used in accordance with the operations of an electronic device that memory array 100-a is a part.

Figure 7:
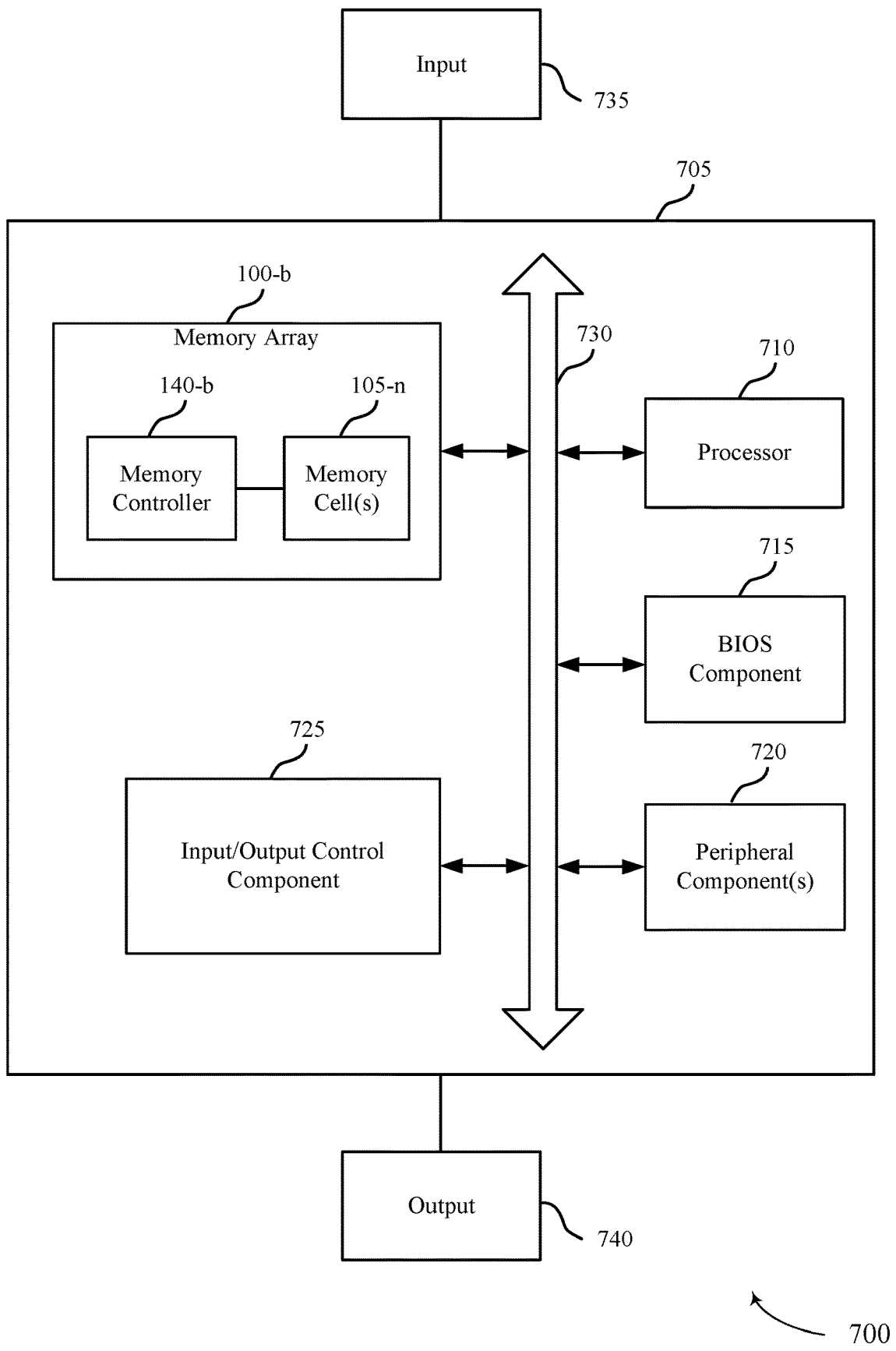
FIG. 7 illustrates a system, including a memory array, that supports half density ferroelectric memory and operation in accordance with various embodiments of the present disclosure.

FIG. 7 illustrates a system 700 that supports half density ferroelectric memory and operation in accordance with various embodiments of the present disclosure. System 700 includes a device 705, which may be or include a printed circuit board to connect or physically support various components. Device 705 may be a computer, notebook computer, laptop, tablet computer, mobile phone, or the like. Device 705 includes a memory array 100-b, which may be an example of memory array 100 or 500 as described with reference to FIGS. 1, 5 and 6. Memory array 100-b may contain memory controller 140-b and memory cell(s) 105-n, which may be examples of memory controller 140 described with reference to FIGS. 1 and 6 and memory cells 105 described with reference to FIGS. 1, 2, and 4-6. Device 705 may also include a processor 710, BIOS component 715, peripheral component(s) 720, and input/output control component 725. The components of device 705 may be in electronic communication with one another through bus 730.

Processor 710 may be configured to operate memory array 100-b through memory controller 140-b. In some cases, processor 710 may perform the functions of memory controller 140 described with reference to FIGS. 1-6. In other cases, memory controller 140-b may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including operating memory array 100-b in half density mode. Processor 710 may, for example, be configured to execute computer-readable instructions stored in memory array 100-b to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740. Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output 740 may represent a device or signal external to device 705 configured to receive output from device 705 or any of its components. Examples of output 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-*b*, device 705, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
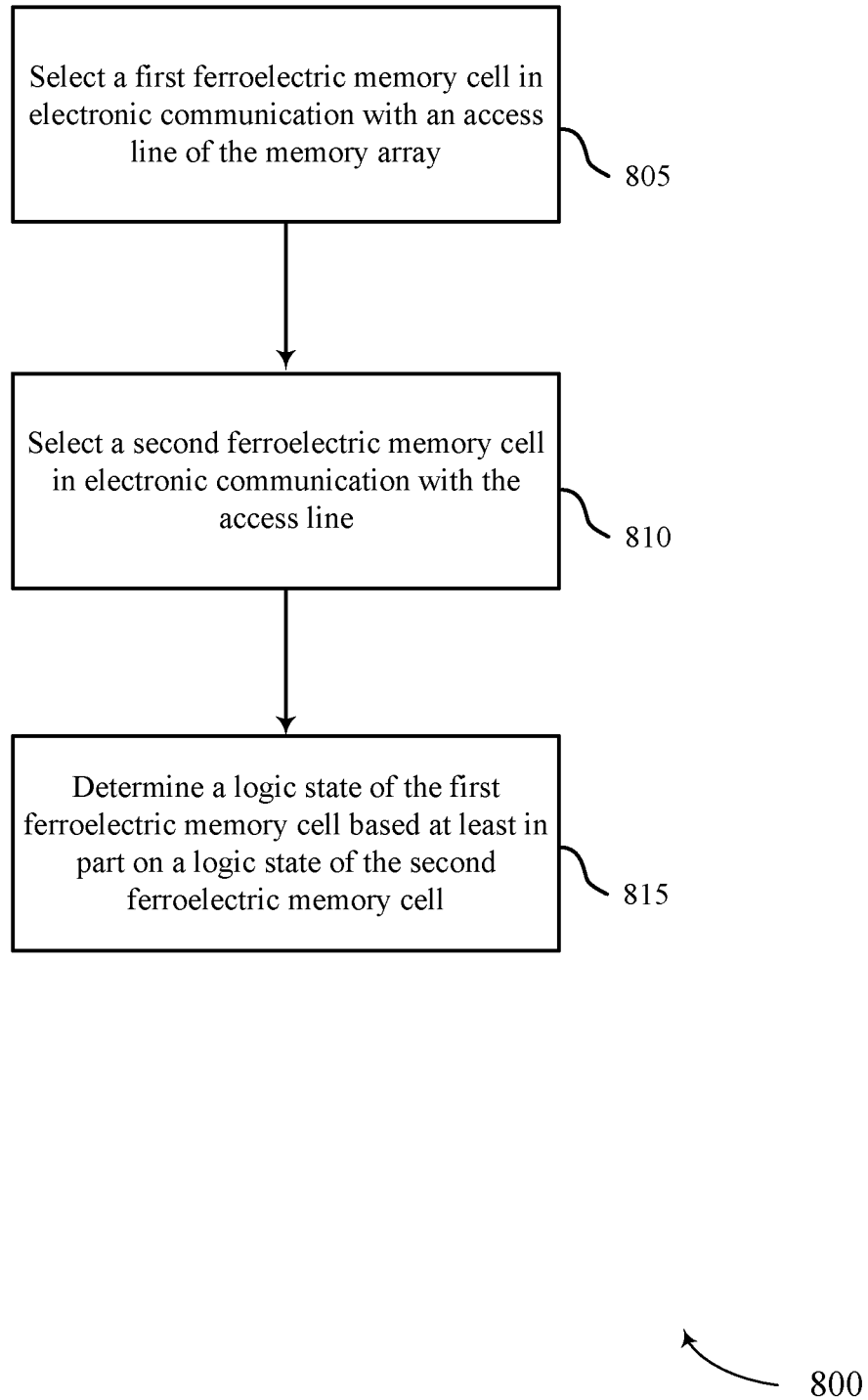
FIGS. 8 and 9 are flowcharts that illustrate a method or methods for half density ferroelectric memory and operation in accordance with various embodiments of the present disclosure.

FIG. 8 shows a flowchart illustrating a method 800 for half density ferroelectric memory and operation in accordance with various embodiments of the present disclosure. The operations of method 800 may be implemented by a memory array 100 or 500, as described with reference to FIGS. 1, 5, 6, and 7. For example, the operations of method 800 may be performed by a memory controller 140 as described with reference to FIGS. 1 and 5-7. In some examples, a memory controller 140 may execute a set of codes to control the functional elements of the memory array 100 to perform the functions described below. Additionally or alternatively, the memory controller 140 may perform features of the functions described below using special-purpose hardware.

At block 805, the method may include selecting a first ferroelectric memory cell in electronic communication with an access line of the memory array, as described with reference to FIGS. 1, 2, 4-6. In certain examples, the operations of block 805 may be performed or facilitated by the memory controller 140, as described with reference to FIGS. 1 and 5-7.

At block 810, the method may include selecting a second ferroelectric memory cell in electronic communication with the access line, as described with reference to FIGS. 1, 2, 4-6. In some examples, the logic state of the second ferroelectric memory cell may be opposite the logic state of the first ferroelectric memory cell. In certain examples, the operations of block 810 may be performed or facilitated by the memory controller 140, as described with reference to FIGS. 1 and 5-7.

At block 815, the method may include determining a logic state of the first ferroelectric memory cell based at least in part on a logic state of the second ferroelectric memory cell, as described with reference to FIGS. 1, 2, 4-6. In some examples, determining the logic state of the first ferroelectric memory cell includes comparing a first signal indicative of the logic state of the first ferroelectric memory cell to a second signal indicative of the logic state of the second ferroelectric memory cell at a same sense component. In certain examples, the operations of block 815 may be performed or facilitated by the memory controller 140, as described with reference to FIGS. 1 and 5-7, or a sense component 125, as described with reference to FIGS. 1, 2, and 4-6.

The method may further include activating a switch to couple the second ferroelectric memory cell with a sense component that is in electronic communication with the first ferroelectric memory cell. The method may also include applying a voltage to an isolation component to couple the first ferroelectric memory cell with a sense component.

In some examples, the method may include performing a write-back operation based on determining the logic state of the first ferroelectric memory cell, where the write-back operation restores the logic state of the first ferroelectric memory cell and the logic state of the second ferroelectric memory cell.

The method may also include receiving a command to write the first ferroelectric memory cell with the logic state, writing the first ferroelectric memory cell with the logic state in response to the command, and writing the second ferroelectric memory cell with an opposite logic state based at least in part on receiving the command to write to the first ferroelectric memory cell.

Figure 9:
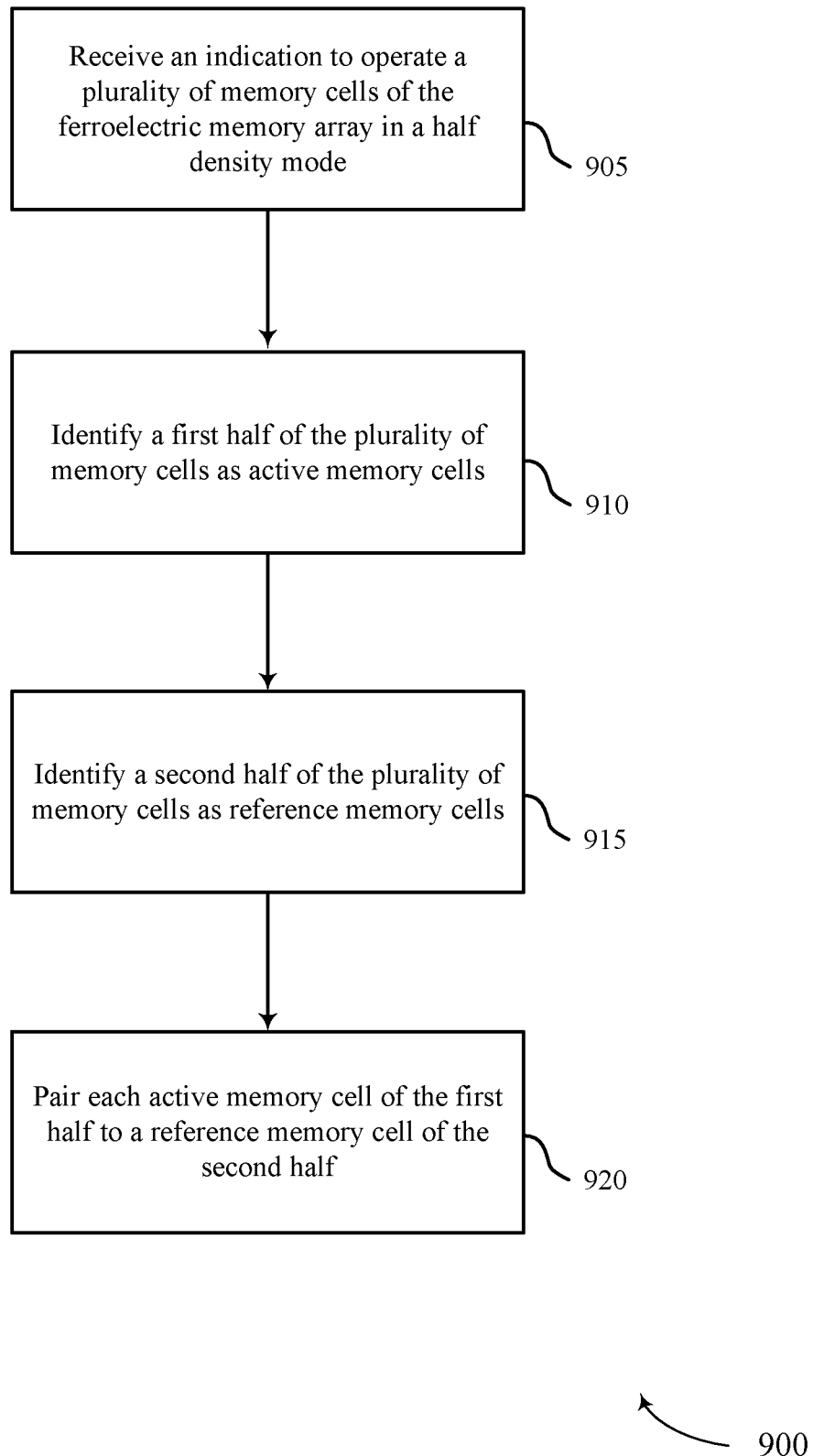

FIG. 9 shows a flowchart illustrating a method 900 for half density ferroelectric memory and operation in accordance with various embodiments of the present disclosure. The operations of method 900 may be implemented by a memory array 100 or 500, as described with reference to FIGS. 1, 5, 6, and 7. For example, the operations of method 900 may be performed by a memory controller 140 as described with reference to FIGS. 1 and 5-7. In some examples, a memory controller 140 may execute a set of codes to control the functional elements of the memory array 100 to perform the functions described below. Additionally or alternatively, the memory controller 140 may perform features of the functions described below using special-purpose hardware.

At block 905, the method may include receiving an indication to operate a plurality of memory cells of the ferroelectric memory array in a half density mode, as described with reference to FIGS. 1, 2, 4-6. In some examples, receiving the indication includes receiving the indication from a user or device of which the ferroelectric memory array is a component. In other examples, receiving the indication to operate the plurality of memory cells in the half density mode may be based on determining that a temperature of the memory array is outside a range of temperatures. In certain examples, the operations of block 905 may be performed or facilitated by the memory controller 140, as described with reference to FIGS. 1 and 5-7.

At block 910, the method may include identifying a first half of the plurality of memory cells as active memory cells, as described with reference to FIGS. 1, 2, 4-6. In certain examples, the operations of block 910 may be performed or facilitated by the memory controller 140, as described with reference to FIGS. 1 and 5-7.

At block 915, the method may include identifying a second half of the plurality of memory cells as reference memory cells, as described with reference to FIGS. 1, 2, 4-6. In certain examples, the operations of block 915 may be performed or facilitated by the memory controller 140, as described with reference to FIGS. 1 and 5-7.

At block 920, the method may include pairing each active memory cell of the first half to a reference memory cell of the second half, as described with reference to FIGS. 1, 2, 4-6. In some examples, an active memory cell and a reference memory cell of each pair are in electronic communication with a common access line. In certain examples, the operations of block 920 may be performed or facilitated by the memory controller 140, as described with reference to FIGS. 1 and 5-7.

In some examples, the method may include deactivating a plurality of sense components in electronic communication with the reference memory cells. The method may also include determining a logic state for an active memory cell of the plurality and writing to a reference memory cell paired to the active memory cell a logic state opposite the logic state of the active memory cell.

In some cases, the plurality of memory cells is a first subset of the ferroelectric memory array and a remainder of the memory cells is a second subset of the ferroelectric memory array. In such cases, the method may include operating the first subset of the ferroelectric memory array in the half density mode and operating the second subset of the ferroelectric memory array in a normal mode, where each memory cell coupled to a common access line of the second subset is an active memory cell. The method may further include storing a logic state of at least one reference memory cell of the first subset of the ferroelectric memory array in a memory cell of the second subset of the ferroelectric memory array. In some examples, the first subset of the ferroelectric memory array may be a sector or a bank.

Thus, methods 800 and 900 may be a method or methods of operating a memory array. For example, they may provide for half density ferroelectric memory and operation. It should be noted that methods 800 and 900 describe possible implementations, and the operations and steps may be rearranged or otherwise modified such that other implementations are possible. In some examples, features from two or more of the methods 800 and 900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The term "couple" refers to a relationship between connected components. Components that are coupled are connected to and may communicate or transfer signals between each other. For example, a switch may couple components when the switch creates a closed circuit such that electrical current may flow between the components.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   selecting a first memory cell and a second memory cell;
   activating a sense component coupled with the first memory cell and the second memory cell based at least in part selecting the first memory cell and the second memory cell;
   selecting a third memory cell and a fourth memory cell;
   activating a switch to couple the third memory cell with the sense component based at least in part on selecting the third memory cell and the fourth memory cell; and
   determining a logic state of the third memory cell based at least in part on a logic state of the fourth memory cell.

2. The method of claim 1, further comprising:
   determining a logic state of the fourth memory cell based at least in part on selecting the third memory cell and the fourth memory cell.

3. The method of claim 1, wherein determining the logic state of the third memory cell comprises:
   comparing the logic state of the third memory cell to the logic state of the fourth memory cell at the sense component.

4. The method of claim 1, further comprising:
   determining a logic state of the first memory cell based at least in part on a logic state of the second memory cell.

5. The method of claim 1, further comprising:
   activating a second switch to couple the first memory cell with the sense component, wherein activating the sense component is based at least in part on activating the second switch.

6. The method of claim 1, further comprising:
deactivating a second sense component coupled with the second memory cell based at least in part on activating the sense component.

7. The method of claim 1, further comprising:
applying a threshold voltage to a transistor of the switch to couple the fourth memory cell with the sense component.

8. The method of claim 1, further comprising:
applying a voltage to an isolation component to couple the third memory cell with the sense component.

9. The method of claim 1, wherein the fourth memory cell is configured to provide a reference input to the sense component for sensing the third memory cell.

10. The method of claim 1, wherein the second memory cell is configured to provide a reference input to the sense component for sensing the first memory cell.

11. An electronic memory apparatus, comprising:
a first memory cell;
a second memory cell coupled with the first memory cell;
a sense component coupled with the first memory cell and the second memory cell;
a third memory cell coupled with the sense component;
a fourth memory cell coupled with the sense component; and
a controller coupled with the sense component, the first memory cell and second memory cells, or the third memory cell and the fourth memory cell, wherein the controller is operable to:
select the first memory cell and the second memory cell;
activate the sense component based at least in part selecting the first memory cell and the second memory cell;
select the third memory cell and the fourth memory cell;
activate a switch to couple the third memory cell with the sense component based at least in part on selecting the third memory cell and the fourth memory cell; and
determine a logic state of the third memory cell based at least in part on a logic state of the fourth memory cell.

12. The electronic memory apparatus of claim 11, wherein the controller is operable to:
determine a logic state of the first memory cell based at least in part on a logic state of the second memory cell.

13. The electronic memory apparatus of claim 11, wherein the controller is operable to:
determine a logic state of the fourth memory cell based at least in part on selecting the fourth memory cell.

14. The electronic memory apparatus of claim 11, wherein the controller is operable to:
compare the logic state of the third memory cell to the logic state of the fourth memory cell.

15. The electronic memory apparatus of claim 11, wherein the controller is operable to:
apply a threshold voltage to the switch; and
couple the fourth memory cell with the sense component based at least in part on applying the threshold voltage to the switch.

* * * * *